(12) United States Patent
Wu et al.

(10) Patent No.: US 9,142,445 B2
(45) Date of Patent: *Sep. 22, 2015

(54) METHOD AND APPARATUS FOR FORMING SHALLOW TRENCH ISOLATION STRUCTURES HAVING ROUNDED CORNERS

(71) Applicant: Marvell World Trade Ltd., St. Michael (BB)

(72) Inventors: Albert Wu, Palo Alto, CA (US); Runzi Chang, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/081,778

(22) Filed: Nov. 15, 2013

(65) Prior Publication Data

US 2014/0080285 A1 Mar. 20, 2014

Related U.S. Application Data

(60) Division of application No. 13/584,518, filed on Aug. 13, 2012, now abandoned, which is a continuation of application No. 12/171,173, filed on Jul. 10, 2008, now Pat. No. 8,241,993.

(60) Provisional application No. 60/949,648, filed on Jul. 13, 2007.

(51) Int. Cl.
  *H01L 21/762* (2006.01)
  *H01L 21/308* (2006.01)
  *H01L 21/306* (2006.01)

(52) U.S. Cl.
  CPC ...... *H01L 21/76224* (2013.01); *H01L 21/3083* (2013.01); *H01L 21/30608* (2013.01); *H01L 21/76232* (2013.01)

(58) Field of Classification Search
  CPC .............. H01L 21/76224; H01L 21/76232; H01L 21/762
  USPC .......... 438/424, 718, 425, 701; 257/E21.267, 257/E21.284, E21.548
  See application file for complete search history.

(56) References Cited

U.S. PATENT DOCUMENTS 5,801,083 A   9/1998 Yu et al.
6,211,006 B1 * 4/2001 Tsai et al. ............... 438/246
(Continued)

FOREIGN PATENT DOCUMENTS

EP   1376683(B1)   1/2004

OTHER PUBLICATIONS

Clarycon Plasma Technology for Advance Devices, "Shallow Trench Etch Bottom Corner Rounding", retreived from http://www.clarycon.com/shallowtrenchisa.html, 1 page, 2008.

*Primary Examiner* — Minchul Yang

(57) ABSTRACT

Methods for rounding the bottom corners of a shallow trench isolation structure are described herein. Embodiments of the present invention provide a method comprising forming a first masking layer on a sidewall of an opening in a substrate, removing, to a first depth, a first portion of the substrate at a bottom surface of the opening having the first masking layer therein, forming a second masking layer on the first masking layer in the opening, and removing, to a second depth, a second portion of the substrate at the bottom surface of the opening having the first and second masking layers therein. Other embodiments also are described.

16 Claims, 5 Drawing Sheets

(56) References Cited

U.S. PATENT DOCUMENTS

| | | |
|---|---|---|
| 6,512,273 B1 | 1/2003 | Krivokapic et al. |
| 6,709,924 B1 | 3/2004 | Yu et al. |
| 8,241,993 B2 * | 8/2012 | Wu et al. .................. 438/425 |
| 2002/0110973 A1 | 8/2002 | Liou et al. |
| 2002/0160579 A1 | 10/2002 | Kim |
| 2002/0171118 A1 | 11/2002 | Mandelman et al. |
| 2003/0017710 A1 * | 1/2003 | Yang et al. ................. 438/718 |
| 2003/0027403 A1 | 2/2003 | Hsu |
| 2004/0110358 A1 * | 6/2004 | Lee ............................ 438/437 |
| 2004/0124494 A1 | 7/2004 | Ciovacco et al. |
| 2004/0171254 A1 | 9/2004 | Iijima et al. |
| 2005/0110063 A1 | 5/2005 | Huang et al. |
| 2008/0299740 A1 * | 12/2008 | Tsai et al. .................. 438/425 |
| 2009/0017593 A1 | 1/2009 | Wu et al. |

* cited by examiner

METHOD AND APPARATUS FOR FORMING SHALLOW TRENCH ISOLATION STRUCTURES HAVING ROUNDED CORNERS

CROSS-REFERENCE TO RELATED APPLICATIONS

The present disclosure is a divisional of and claims priority to U.S. patent application Ser. No. 13/584,518, filed Aug. 13, 2012, which is a continuation of and claims priority to U.S. patent application Ser. No. 12/171,173, filed Jul. 10, 2008, now U.S. Pat. No. 8,241,993, issued Aug. 14, 2012, which claims priority to U.S. Provisional Patent Application No. 60/949,648, filed Jul. 13, 2007, which are incorporated herein by reference.

TECHNICAL FIELD

Embodiments of the present invention relate to the field of microelectronic devices, in particular, to methods for rounding the bottom corners of shallow trench isolation structures.

BACKGROUND

Device integration has been, and will continue to be, an important design factor in the integrated circuit manufacturing industry. As the degree of device integration continues to increase, so too does the importance of device isolation. Device isolation ensures that devices are adequately isolated from each other as needed. Shallow trench isolation (STI) is a commonly-used isolation technique as it may allow for the formation of isolation structures in smaller dimensions and may also avoid bird's beak encroachment and other problems sometimes associated with local oxidation of silicon (LOCOS) and other isolation techniques.

SUMMARY OF THE INVENTION

In view of the problems in the state of the art, embodiments of the invention are directed to methods for forming trenches with rounded bottom corners. More specifically, with the foregoing and other items in view, there is provided, in accordance with various embodiments of the invention, a method comprising forming a first masking layer on a sidewall of an opening in a substrate; removing, to a first depth, a first portion of the substrate at a bottom surface of the opening having the first masking layer therein; forming a second masking layer on the first masking layer in the opening; and removing, to a second depth, a second portion of the substrate at the bottom surface of the opening having the first and second masking layers therein, wherein the second depth is greater than the first depth.

In various embodiments, the first masking layer may be formed over the sidewall and over the bottom surface of an opening in a substrate. In various ones of these embodiments, removing of the first portion of the substrate may include removing a bottom portion of the first masking layer, the bottom portion being over the bottom surface of the opening. Removing of the bottom portion of the first masking layer may include leaving the first masking layer on the sidewall. Removing of the bottom portion of the first masking layer may include anisotropically etching the first masking layer so as to remove the bottom portion of the first masking layer without removing the first masking layer on the sidewall.

In various embodiments, the second masking layer may be formed over the bottom surface of the opening and over the first masking layer on the sidewall. Removing of the second portion of the substrate may include removing a bottom portion of the second masking layer, the bottom portion being over the bottom surface of the opening.

In various embodiments, the second portion of the substrate may be narrower than the first portion of the substrate. The removing of the first portion and the removing of the second portion may result in the bottom surface having a rounded shape.

In various embodiments, at least one of the first masking layer and the second masking layer is a polymer material. The polymer material may be a fluorohydrocarbon polymer.

In various embodiments, the first and second masking layers may be removed from the sidewall after removing of the second portion of the substrate. Oxide may be formed in the opening after removing of the first and second masking layers from the sidewall. The forming of the oxide may include forming a liner oxide layer in the opening using an in-situ steam generation (ISSG) operation. The ISSG operation may be performed at a temperature greater than 1000° Celsius (C.) for about 30 seconds.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous. The phrase "A/B" means A or B. For the purposes of the present invention, the phrase "A and/or B" means "(A), (B), or (A and B)." The phrase "at least one of A, B, and C" means "(A), (B), (C), (A and B), (A and C), (B and C), or (A, B, and C)." The phrase "(A)B" means "(B) or (AB)," that is, A is an optional element.

The terms chip, die, integrated circuit, monolithic device, semiconductor device, and microelectronic device are often used interchangeably in the microelectronics field. The present invention is applicable to all of the above as they are generally understood in the field.

Various embodiments of the present invention are directed to methods for rounding the bottom corners of substrate openings such as, for example, shallow trench isolation (STI) structures. Rounding the bottom corners of these structures may result in reduced stress at the corners relative to bottom corners of substrate openings in the related art.

Figure 1:
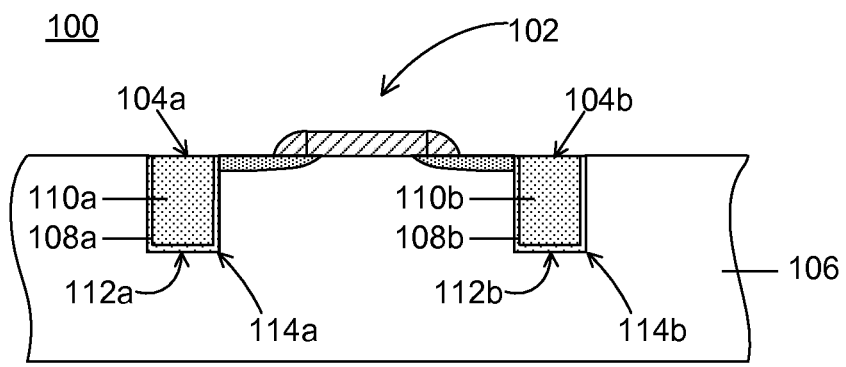
FIG. 1 illustrates a cross-sectional side view of a related art microelectronic device.

A cross-sectional side view of an exemplary related art microelectronic device 100 is illustrated at FIG. 1. As illustrated, device 100 includes a device component such as, for example, transistor 102. Transistor 102 is bounded by two STI structures 104a, 104b. STI structures 104a, 104b are formed in substrate 106 and may be lined with a liner oxide 108a, 108b and filled with a trench oxide 110a, 110b.

STI structures 104a, 104b have flat bottom surfaces 112a, 112b and sharp corners 114a, 114b. Sharp corners 114a, 114b may lead to increased stress for the layers formed thereover (e.g., liner oxide 108a, 108b), which may result in undesirable electrical breakdown and leakage. This stress may be due, in some cases, to the thermal oxidation process used for forming liner oxide 108a, 108b. As the thermal oxide is grown from the surface silicon atoms of substrate 106, the silicon oxide molecules become crowded in corners 114a, 114b due to the size difference between silicon oxide molecules and silicon atoms (a silicon oxide molecule may be approximately 2.17 times greater in size than a silicon atom).

In order to reduce the stress associated with sharp corners 114a, 114b, an anneal operation is sometimes performed after the thermal oxidation operation for forming liner oxide 108a, 108b. Although annealing may be capable of reducing the amount of stress present in corners 114a, 114b, it is a rather time- and thermal-budget-consuming operation. In some operations, for example, the anneal operation may take more than 30 minutes to perform on top of the more than 30 minutes it may take to perform the liner oxidation itself. Moreover, the anneal and/or liner oxidation operation may be performed at temperatures exceeding 1000° Celsius (C.).

Figure 2:
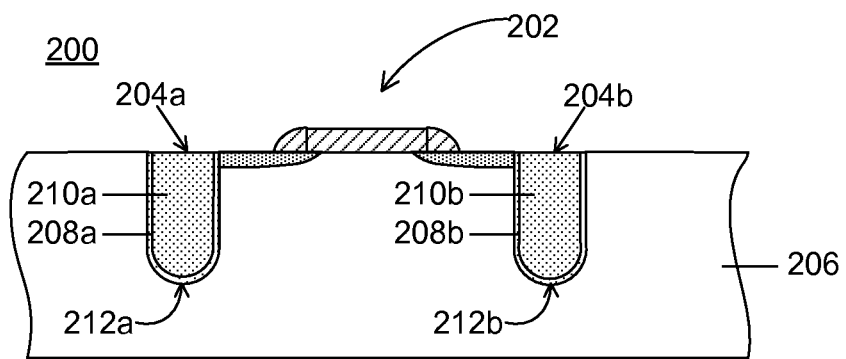
FIG. 2 illustrates a cross-sectional side view of an exemplary microelectronic device including shallow trench isolation structures with rounded bottom corners in accordance with various embodiments of the present invention.

Illustrated at FIG. 2 is an exemplary microelectronic device 200 including STI structures 204a, 204b with rounded bottom surfaces 212a, 212b formed using methods in accordance with various embodiments of the present invention. As illustrated, device 200 includes a device component such as, for example, transistor 202. STI structures 204a, 204b are formed in substrate 206 and may be lined with liner oxide 208a, 208b and filled with a trench oxide 210a, 210b.

Rounding of bottom surfaces 212a, 212b may result in a minimization of the stress experienced by the liner oxide 208a, 208b relative to that of various related art STI structures such as, for example, STI structures 104a, 104b of device 100 illustrated at FIG. 1. This may be due, at least in part, to the reduction or elimination of the sharp corners of the STI structure. As noted above, stress may be increased due to the confined space of sharp corners, which may result in silicon oxide molecules being crowded in the corners. In contrast, the sloped bottom of STI structures 204a, 204b may allow for more room for the molecules of liner oxide 208a, 208b.

An exemplary method for forming STI structures with rounded bottom corners is illustrated at FIGS. 3-13 as cross-sectional views of a microelectronic device after various operations of the method.

Figure 3:
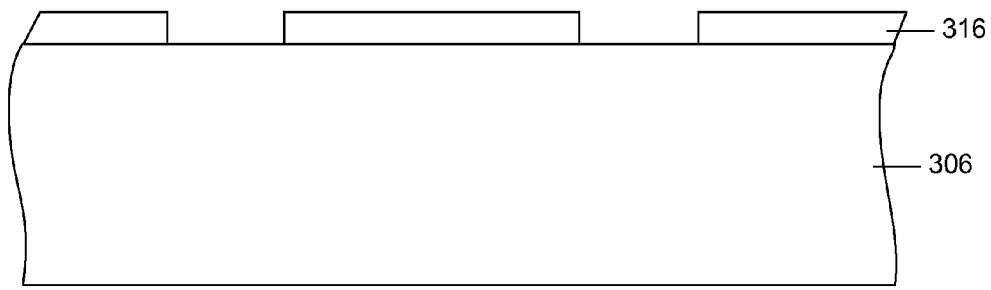
FIGS. 3-13 illustrate various stages of a method for forming shallow trench isolation structures with rounded bottom corners in accordance with various embodiments of the present invention.

As illustrated at FIG. 3, a hardmask 316 is provided over a substrate 306. Hardmask 316 may be formed to cover the surface of substrate 306 except for those areas at which an STI structure is to be formed, as illustrated. Hardmask 316 may comprise any material or apparatus known in the art and suitable for protecting those areas of substrate 306 which are not to receive subsequent etching. In some embodiments, hardmask 316 may comprise a silicon nitride material deposited over the surface of substrate 306. Intermediate layers (not illustrated) may be formed between hardmask 316 and substrate 306 including, for example, a pad oxide layer.

Figure 4:
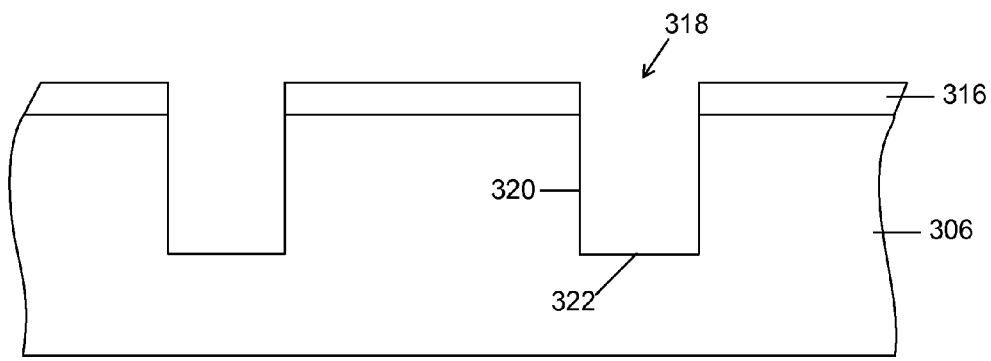

Those areas of substrate 306 not protected by hardmask 316 may be etched as illustrated at FIG. 4 to form openings 318 in substrate 306. In order to form openings 318 with vertical sidewalls 320 and a generally flat bottom surface 322, substrate 306 may be anisotropically etched. The depth of openings 318 may be governed, at least in part, by the desired ultimate depth of the STI structure to be formed as will become more evident in the discussion to follow. In general, the depth of STI structures should be suitable to provide adequate device isolation. In some embodiments, for example, the depth of openings 318 is between approximately 100 nanometers and 800 nanometers.

Figure 5:
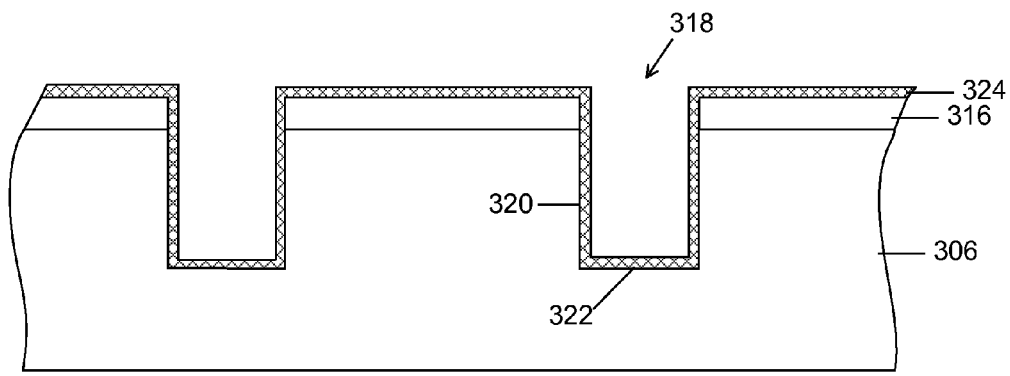

A masking layer 324 may be formed over hardmask 316 and sidewalls 320 and bottom surfaces 322 of openings 318 as illustrated at FIG. 5. Masking layer 324 may be formed conformally as illustrated.

Masking layer 324 may comprise any material suitable for purposes described herein. In some embodiments, for example, masking layer 324 may comprise a dielectric material. Exemplary dielectric materials may include one comprising a hydrocarbon, a fluorocarbon, or a fluorohydrocarbon. In various embodiments, for example, masking layer 324 comprises a fluorohydrocarbon polymer material.

In various embodiments, hardmask 316 and masking layer 324 may be formed in the same piece of equipment, but in other embodiments, separate pieces of equipment may be used. Certain efficiencies may be evident, however, in forming hardmask 316 and masking layer 324 in the same piece of equipment including, for example, increased throughput due to elimination of transfer time.

Figure 6:
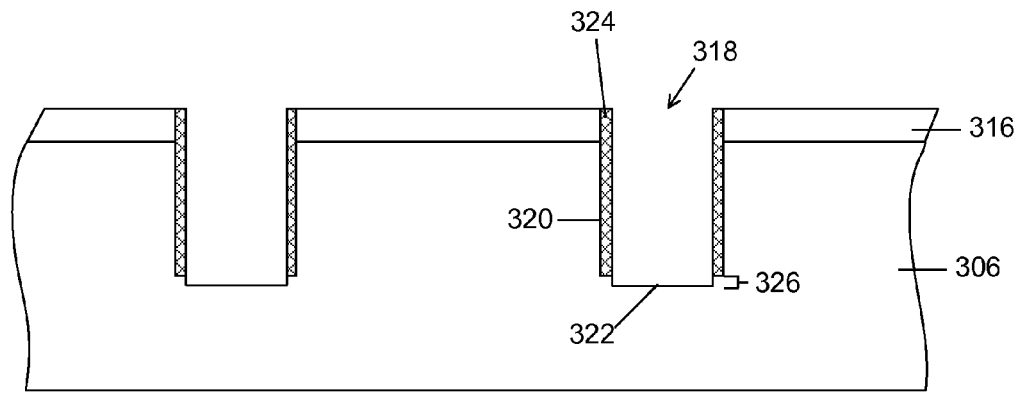

Portions of masking layer 324 may then be etched as illustrated at FIG. 6. As illustrated, the portions of masking layer 324 over sidewalls 320 of openings 318 are not etched away during this operation, but rather, remain on sidewalls 318. In order to achieve this, an anisotropic etch process may be used. Because anisotropic etching is a highly-directional etch operation, horizontal portions of masking layer 324 may be etched away, as illustrated, while vertical portions remain.

During the etch operation for etching portions of masking layer 324, some of bottom surfaces 322 of substrate 306 may also be etched. As illustrated, a thickness 326 of substrate 306 is etched such that the etched portion of openings 318 has a greater overall depth relative to its starting depth (compare, e.g., to FIG. 4). The portions of bottom surfaces 322 adjacent to masking layer 324 remaining on sidewalls 320 may be lightly etched or not etched at all, however. Accordingly, a center portion of openings 318 is slightly deeper than the edge portion.

The operations described herein with reference to FIG. 5 and FIG. 6 may be repeated a plurality of times for forming rounded bottom surfaces 322 of openings 318. Each iteration may etch deeper into center portions of bottom surfaces 322 of openings 318, until a substantially rounded shape is achieved. It is noted that as used herein, a "bottom surface having a rounded shape" may include any configuration in which a transition from the sidewall to a bottom surface occurs in a graduated (or incremental) manner.

Figure 7:
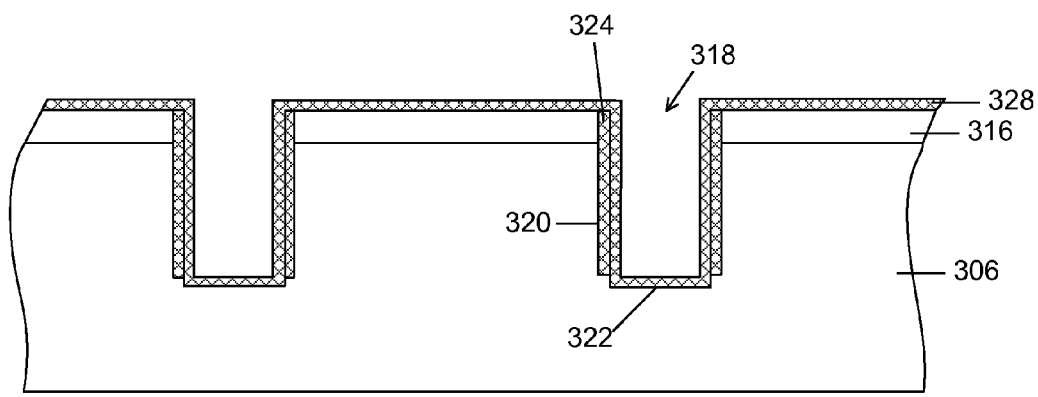

In a second iteration, for example, another masking layer 328 may be formed over hardmask 316 and also over masking layer 324 remaining on sidewalls 320 of openings 318 and over bottom surfaces 322 as illustrated at FIG. 7. In various embodiments, masking layer 328 may be formed using the same material and same general process as for forming masking layer 324. In other embodiments, however, the iterations may be tuned as needed.

Figure 8:
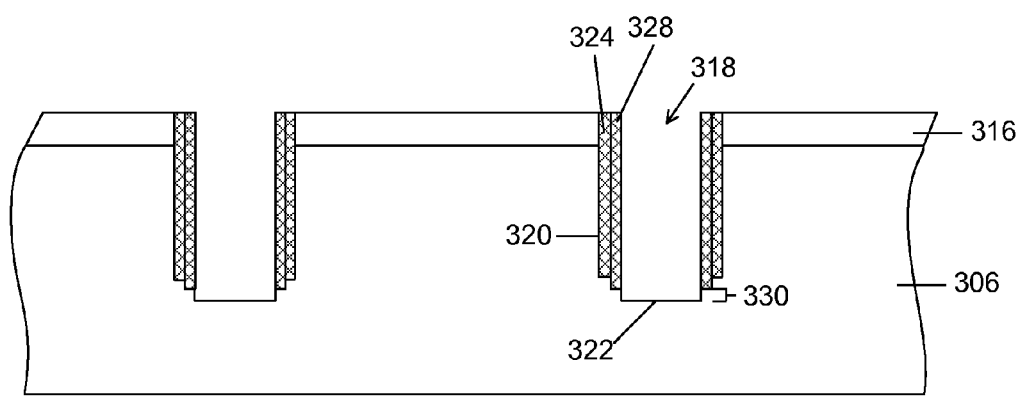

Portions of masking layer 328 may then be etched as illustrated at FIG. 8. As illustrated, the portions of masking layer 328 over masking layer 324 on sidewalls 320 of openings 318 are not etched away during this operation, but rather, remain on masking layer 324. In order to achieve this, an anisotropic etch process may be used, etching horizontal portions of masking layer 328 while allowing vertical portions to remain.

During the etch operation for etching portions of masking layer 328, some of bottom surfaces 322 of substrate 306 may also be etched as described above. As illustrated, another thickness 330 of substrate 306 is etched such that the etched portion of openings 318 has a greater overall depth relative to its depth in a preceding iteration (compare, e.g., to FIG. 6). The portions of bottom surfaces 322 adjacent to masking layer 328 may be lightly etched or not etched at all, however.

Figure 9:
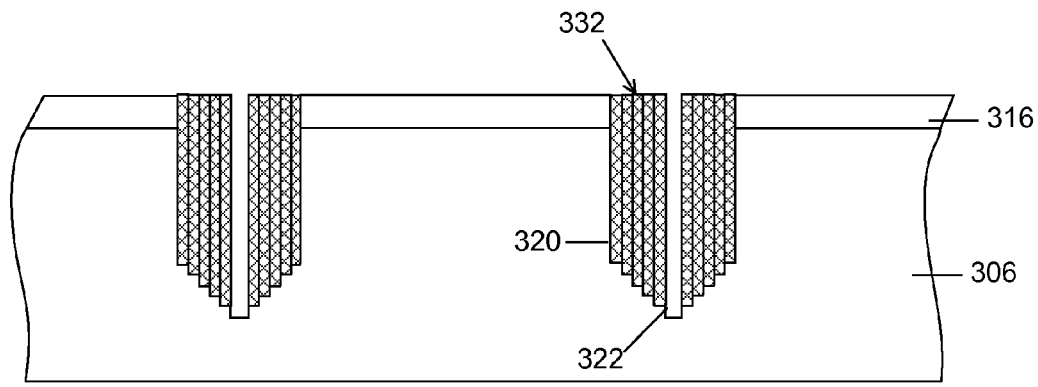

After a desired number of iterations of forming and etching of the masking layers is performed, a plurality of masking layers 332 may remain on sidewalls 320 of openings 318 as illustrated at FIG. 9. As illustrated, bottom surfaces 322 of openings 318 are tapered. Although the illustrated structure depicts bottom surface 322 having a stepped shaped, in various embodiments the masking layers and etch operations may be adjusted to fine-tune the curve of bottom surfaces 322. For example, using thinner masking layers may result in a more gradually curved, smoother surface.

Figure 10:
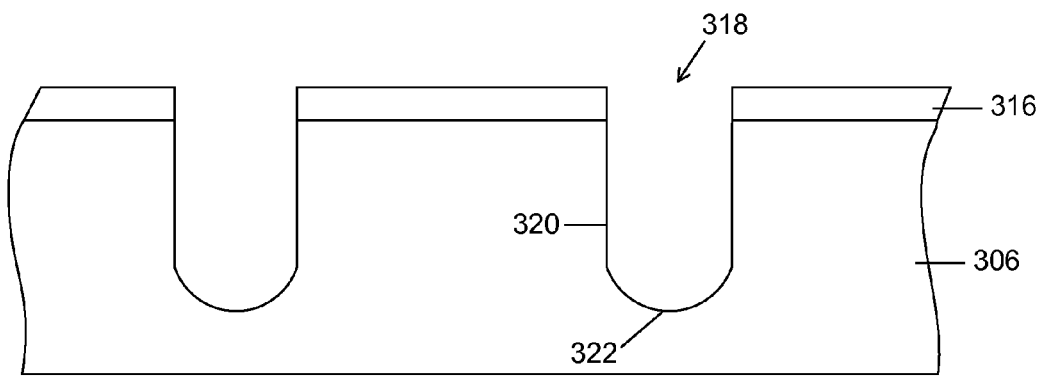

The remaining masking layers 332 may be etched to expose bottom surfaces 322 and sidewalls 320 of openings 318 as illustrated at FIG. 10. Any suitable etch operation may be used for removing masking layers 332. In various embodiments, an isotropic etch may be suitable for removing masking layers 332, as directionality may not be required.

Figure 11:
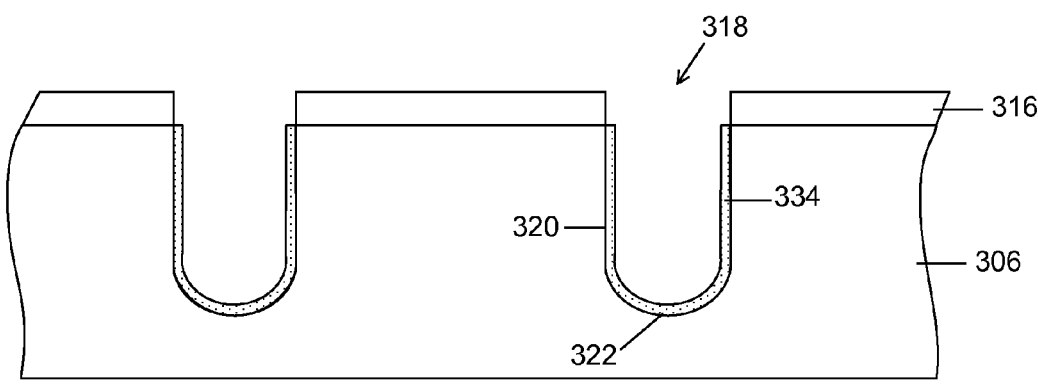

Turning now to FIG. 11, a liner oxide 334 may be formed in openings 318 having rounded bottom surfaces 322. Liner oxide 334 may be formed using any method suitable for the purpose. In some embodiments, liner oxide 334 may be formed using a wet oxidation process including, for example, in-situ steam generation (ISSG). In various embodiments, an anneal operation may not be necessary after forming liner oxide 334 due at least in part to the rounded bottom surfaces 322 resulting in liner oxide 334 having less stress relative to oxide formed in openings having squared-off bottom corners. Moreover, in various embodiments, formation of liner oxide 334 may be performed in much less time relative to related art methods. For example, in some embodiments, liner oxide 334 may be formed in less than about a minute due to this low-stress condition (compared to 30 minutes or more in some related art methods). In an exemplary embodiment, liner oxide 334 is formed using ISSG at about 1050° C. for about 30 seconds. Other methods may be similarly suitable.

Figure 12:
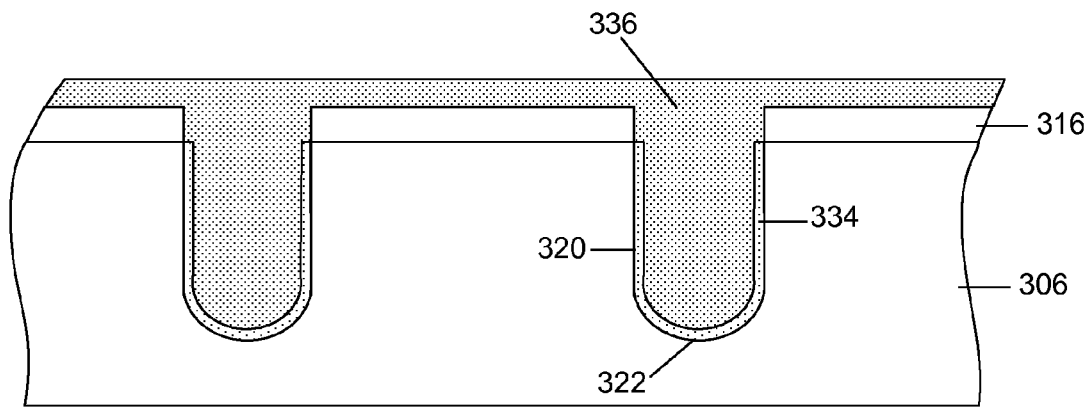
Figure 13:
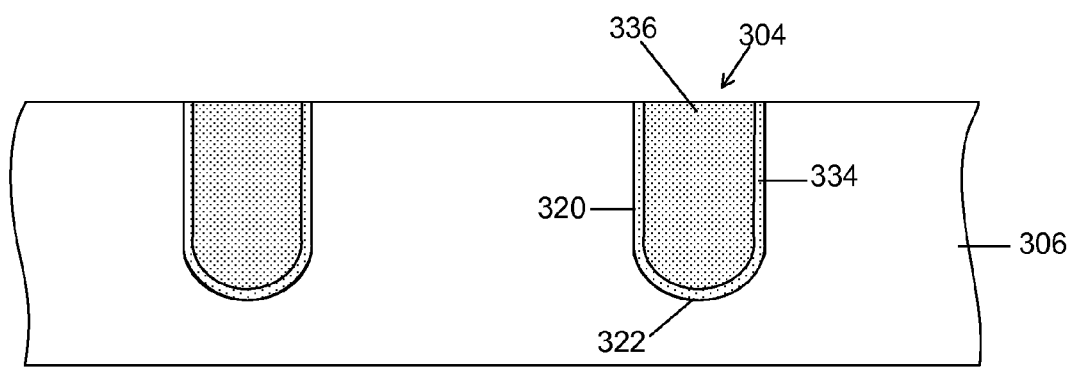

Openings 318 may be filled with a trench oxide 336 as illustrated at FIG. 12. A chemical-mechanical planarization operation may be performed to remove the remaining hardmask 316 and any excess trench oxide 336 as illustrated at FIG. 13.

STI structures 304 may be formed before, after, or during formation of device components such as, for example, transistors (see, e.g., transistor 202 at FIG. 2). In any event, formation of STI structures 304 having rounded bottom surfaces 322 may provide for reduced leakage, and thus, higher reliability devices relative to various related art devices due at least in part to reduction or elimination of high stress bottom corners. Moreover, thermal cycling of the device may be reduced according to various embodiments, which may also affect performance of the device.

Although STI structures formed in accordance with various embodiments of the present invention may be suitable for different types of devices, high-transistor-density devices may find these embodiments particularly beneficial. Memory devices, for example, may include dense arrays of transistors isolated by shallow trench isolation structures.

Although certain embodiments have been illustrated and described herein for purposes of description of a preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
    forming an opening in a substrate, wherein the opening in the substrate has (i) sidewalls and (ii) a bottom surface, and wherein the opening in the substrate has a first depth;
    forming a first masking layer on (i) the sidewalls of the opening and (ii) the bottom surface of the opening;
    during a first etching operation, selectively etching (i) the first masking layer formed on the bottom surface of the opening such that the first masking layer formed on the sidewalls of the opening is not etched, and (ii) a first portion of the substrate at the bottom surface of the opening such that the opening in the substrate has a second depth, wherein the second depth is different from the first depth, and wherein subsequent to selectively etching the first masking layer, a first portion of the first masking layer remains on the sidewalls of the opening, wherein the first etching operation to selectively etch the first masking layer formed on the bottom surface of the opening is continued, without stopping, until completion of the selective etching of the first portion of the substrate at the bottom surface of the opening;
    subsequent to selectively etching the first masking layer, forming a second masking layer on (i) the first portion of the first masking layer remaining on the sidewalls of the opening and (ii) the bottom surface of the opening;
    during a second etching operation, selectively etching (i) the second masking layer formed on the bottom surface of the opening such that the second masking layer formed on the first portion of the first masking layer is not etched, and (ii) a second portion of the substrate at the bottom surface of the opening such that the opening in the substrate has a third depth, wherein the third depth is different from the second depth, and wherein subsequent to selectively etching the second masking layer, a first portion of the second masking layer remains on the first portion of the first masking layer; and
    subsequent to selectively etching the second masking layer, removing (i) the first portion of the first masking layer remaining on the sidewalls of the opening and (ii) the first portion of the second masking layer remaining on the first portion of the first masking layer.

2. The method of claim 1, wherein removing (i) the first portion of the first masking layer remaining on the sidewalls of the opening and (ii) the first portion of the second masking layer remaining on the first portion of the first masking layer results in formation of a substantially rounded corner between the sidewalls of the opening and the bottom surface of the opening.

3. The method of claim 1, wherein removing (i) the first portion of the first masking layer remaining on the sidewalls of the opening and (ii) the first portion of the second masking layer remaining on the first portion of the first masking layer results in a graduated transition from the sidewalls of the opening to the bottom surface of the opening.

4. The method of claim 1, wherein the opening forms a shallow trench isolation structure.

5. The method of claim 1, further comprising:
subsequent to removing (i) the first portion of the first masking layer remaining on the sidewalls of the opening and (ii) the first portion of the second masking layer remaining on the first portion of the first masking layer, forming a linear oxide layer on (i) the sidewalls of the opening and (ii) the bottom surface of the opening.

6. The method of claim 5, wherein:
removing (i) the first portion of the first masking layer remaining on the sidewalls of the opening and (ii) the first portion of the second masking layer remaining on the first portion of the first masking layer results in formation of a substantially rounded corner between the sidewalls of the opening and the bottom surface of the opening; and
the substantially rounded corner between the sidewalls of the opening and the bottom surface of the opening reduces stress of silicon oxide molecules associated with formation of the liner oxide layer on (i) the sidewalls of the opening and (ii) the bottom surface of the opening.

7. The method of claim 5, wherein an anneal operation is not performed while or subsequent to forming the linear oxide layer on (i) the sidewalls of the opening and (ii) the bottom surface of the opening.

8. The method of claim 5, wherein forming the linear oxide layer comprises:
forming the linear oxide layer using an in-situ steam generation (ISSG) operation.

9. The method of claim 8, wherein the ISSG operation is performed at a temperature greater than 1000° Celsius for about 30 seconds.

10. The method of claim 5, further comprising:
subsequent to forming the linear oxide layer on (i) the sidewalls of the opening and (ii) the bottom surface of the opening, filing the opening with trench oxide.

11. The method of claim 1, wherein:
the second depth is higher than the first depth; and
the third depth is higher than the second depth.

12. The method of claim 1, wherein selectively etching the first masking layer formed on the bottom surface of the opening comprises:
anisotropically etching the first masking layer formed on the bottom surface of the opening, without etching the first masking layer formed on the sidewalls of the opening.

13. The method of claim 1, wherein selectively etching the second masking layer formed on the bottom surface of the opening comprises:
anisotropically etching the second masking layer formed on the bottom surface of the opening, without etching the second masking layer formed on the first portion of the first masking layer.

14. The method of claim 1, wherein the second masking layer has a length greater than a length of the first masking layer.

15. The method of claim 1, wherein at least one of the first masking layer or the second masking layer comprises a polymer material.

16. The method of claim 15, wherein the polymer material is a fluorohydrocarbon polymer.

* * * * *